United States Patent
Park et al.

(10) Patent No.: US 11,166,368 B2
(45) Date of Patent: Nov. 2, 2021

(54) PRINTED CIRCUIT BOARD AND SEMICONDUCTOR PACKAGE INCLUDING THE SAME

(71) Applicant: SAMSUNG ELECTRONICS CO., LTD., Suwon-si (KR)

(72) Inventors: Jung Ho Park, Cheonan-si (KR); In Won O, Jeonju-si (KR); Hak Jun Kim, Asan-si (KR)

(73) Assignee: SAMSUNG ELECTRONICS CO., LTD., Suwon-si (KR)

(*) Notice: Subject to any disclaimer, the term of this patent is extended or adjusted under 35 U.S.C. 154(b) by 0 days.

(21) Appl. No.: 16/787,712

(22) Filed: Feb. 11, 2020

(65) Prior Publication Data
US 2020/0260577 A1 Aug. 13, 2020

(30) Foreign Application Priority Data
Feb. 12, 2019 (KR) .......................... 10-2019-0016018

(51) Int. Cl.
*H01L 23/498* (2006.01)
*H01L 25/065* (2006.01)
*H05K 1/02* (2006.01)
*H05K 1/11* (2006.01)

(52) U.S. Cl.
CPC ..... *H05K 1/0278* (2013.01); *H01L 23/49827* (2013.01); *H01L 23/49838* (2013.01); *H05K 1/111* (2013.01); *H01L 25/0657* (2013.01)

(58) Field of Classification Search
CPC .......................... H05K 1/0278; H05K 1/111; H01L 23/49827; H01L 23/49838; H01L 25/0657
See application file for complete search history.

(56) References Cited

U.S. PATENT DOCUMENTS

| | | | |
|---|---|---|---|
| 7,905,730 B2 | 3/2011 | Sakamoto et al. | |
| 7,928,550 B2 | 4/2011 | Wachtler | |
| 8,124,879 B2 | 2/2012 | Ogura | |
| 9,305,855 B2 | 4/2016 | Kim | |
| 2005/0122267 A1* | 6/2005 | Sim | H01Q 21/30 343/702 |
| 2008/0073784 A1 | 3/2008 | Lee | |
| 2008/0116559 A1* | 5/2008 | Hosono | H01L 23/4985 257/686 |
| 2017/0227525 A1* | 8/2017 | Griffith | F04B 43/043 |
| 2018/0287431 A1* | 10/2018 | Liu | H01Q 5/378 |

(Continued)

FOREIGN PATENT DOCUMENTS

| | | |
|---|---|---|
| JP | 1993-226792 | 9/1993 |
| JP | 2001-267700 | 9/2001 |
| JP | 2004-228393 | 8/2004 |

(Continued)

*Primary Examiner* — Douglas W Owens
(74) *Attorney, Agent, or Firm* — F. Chau & Associates, LLC

(57) ABSTRACT

A printed circuit board that includes a base layer having a first surface and a second surface opposing each other. A first structure is disposed on the first surface of the base layer. The first structure includes a first plate structure. A first connection structure is disposed on a same plane as the first plate structure and is spaced apart from the first plate structure. The first plate structure includes first openings. At least some of the first openings are linear openings having a line shape.

20 Claims, 15 Drawing Sheets

(56) References Cited

U.S. PATENT DOCUMENTS

2018/0301798 A1* 10/2018 Ikeda .................. H01Q 9/0421

FOREIGN PATENT DOCUMENTS

| JP | 4627442 | 2/2005 |
|---|---|---|
| JP | 3888678 | 3/2007 |
| KR | 10-2002-0054476 | 7/2002 |
| KR | 10-0876868 | 12/2008 |
| KR | 10-2009-0020197 | 2/2009 |

* cited by examiner

PRINTED CIRCUIT BOARD AND SEMICONDUCTOR PACKAGE INCLUDING THE SAME

CROSS-REFERENCE TO RELATED APPLICATION(S)

This application claims priority under 35 U.S.C. § 119 to Korean Patent Application No. 10-2019-0016018 filed on Feb. 12, 2019 in the Korean Intellectual Property Office, the disclosure of which is incorporated by reference in its entirety herein.

1. TECHNICAL FIELD

The present inventive concept relates to a printed circuit board and a semiconductor package, and more particularly, to a printed circuit board capable of controlling bending properties and a semiconductor package including the same.

2. DISCUSSION OF RELATED ART

Various types of semiconductor packages have been developed as demand for high capacity, thinning, and miniaturization of electronic products has increased. A semiconductor package may include a printed circuit board and a semiconductor chip. As the size of a semiconductor package is reduced, a size and/or a thickness of a printed circuit board becomes increasingly small. A printed circuit board having a small size and/or thickness may be easily bent by the thermal atmosphere created in a solder reflow process that is used in a semiconductor package formation process. A printed circuit board that is bent may increase a defect rate of the semiconductor package formation process.

SUMMARY

An aspect of the present inventive concept is to provide a printed circuit board with improved bending properties.

An aspect of the present inventive concept is to provide a semiconductor package including a substrate structure with improved bending properties.

According to an exemplary embodiment of the present inventive concepts, a printed circuit board includes a base layer having a first surface and a second surface opposing each other. A first structure is disposed on the first surface of the base layer. The first structure includes a first plate structure. A first connection structure is disposed on a same plane as the first plate structure and is spaced apart from the first plate structure. The first plate structure includes first openings. At least some of the first openings are linear openings having a line shape.

According to another exemplary embodiment of the present inventive concepts, a semiconductor package includes a substrate structure. A semiconductor chip is disposed on the substrate structure. The substrate structure includes a base layer and a first structure on a first surface of the base layer. The first structure includes a first plate structure, first connection structures spaced apart from the first plate structure and first openings in the first plate structure. At least some of the first connection structures have all of its side surfaces surrounded by the first plate structure. At least some of the first openings have a line shape.

According to another exemplary embodiment of the present inventive concepts, a semiconductor package includes a lower structure. A substrate structure is disposed on the lower structure. An upper structure is disposed on the substrate structure. The substrate structure includes a base layer and a first structure. The first structure includes a first plate structure and a first connection structure disposed on a same plane as the first plate structure and spaced apart from the first plate structure. The first plate structure includes first openings. At least some of the first openings are linear openings having a line shape.

According to another exemplary embodiment of the present inventive concepts, a method for forming a semiconductor package includes forming a lower structure and a substrate structure. The substrate structure comprises a base layer and a first structure. The first structure includes a first plate structure, a first connection structure disposed on a same plane as the first plate structure and spaced apart from the first plate structure. The first plate structure further includes first openings. At least some of the first openings are linear openings have a line shape. The lower structure and the substrate structure are combined by intermediate connection patterns. An upper structure is mounted on the substrate structure combined with the lower structure.

BRIEF DESCRIPTION OF THE DRAWINGS

The above and other aspects, features and other advantages of the present disclosure will be more clearly understood from the following detailed description, taken in conjunction with the accompanying drawings, in which.

DETAILED DESCRIPTION OF THE EXEMPLARY EMBODIMENTS

Hereinafter, a substrate structure according to exemplary embodiments of the present inventive concepts and a semiconductor package including the same will be described with reference to the drawings.

Figure 1A:
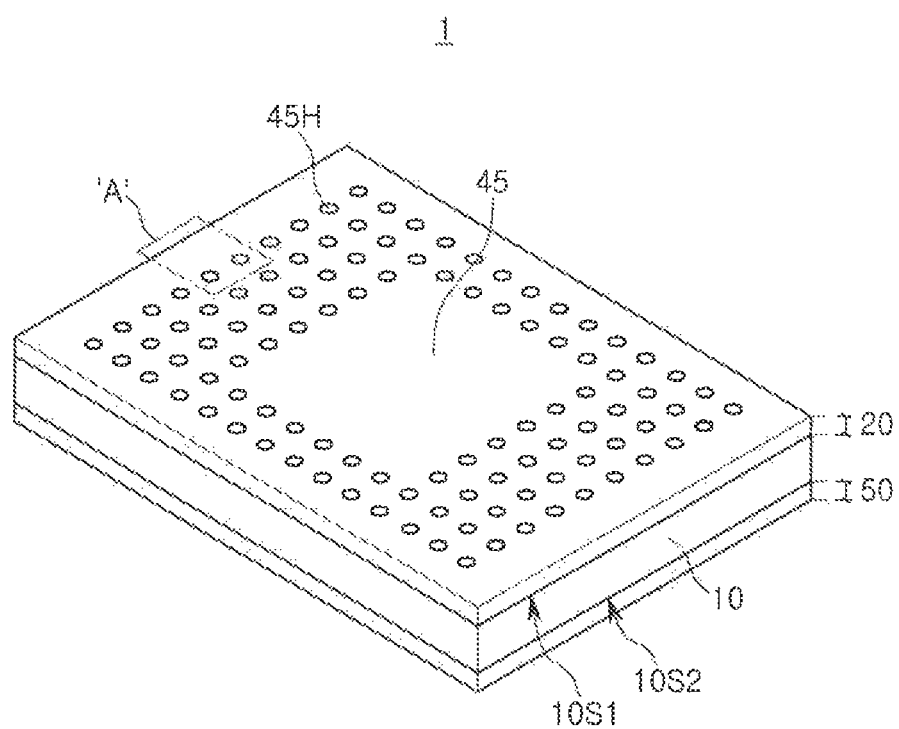
FIG. 1A is a top perspective view illustrating a substrate structure according to an exemplary embodiment of the present inventive concepts.
Figure 1B:
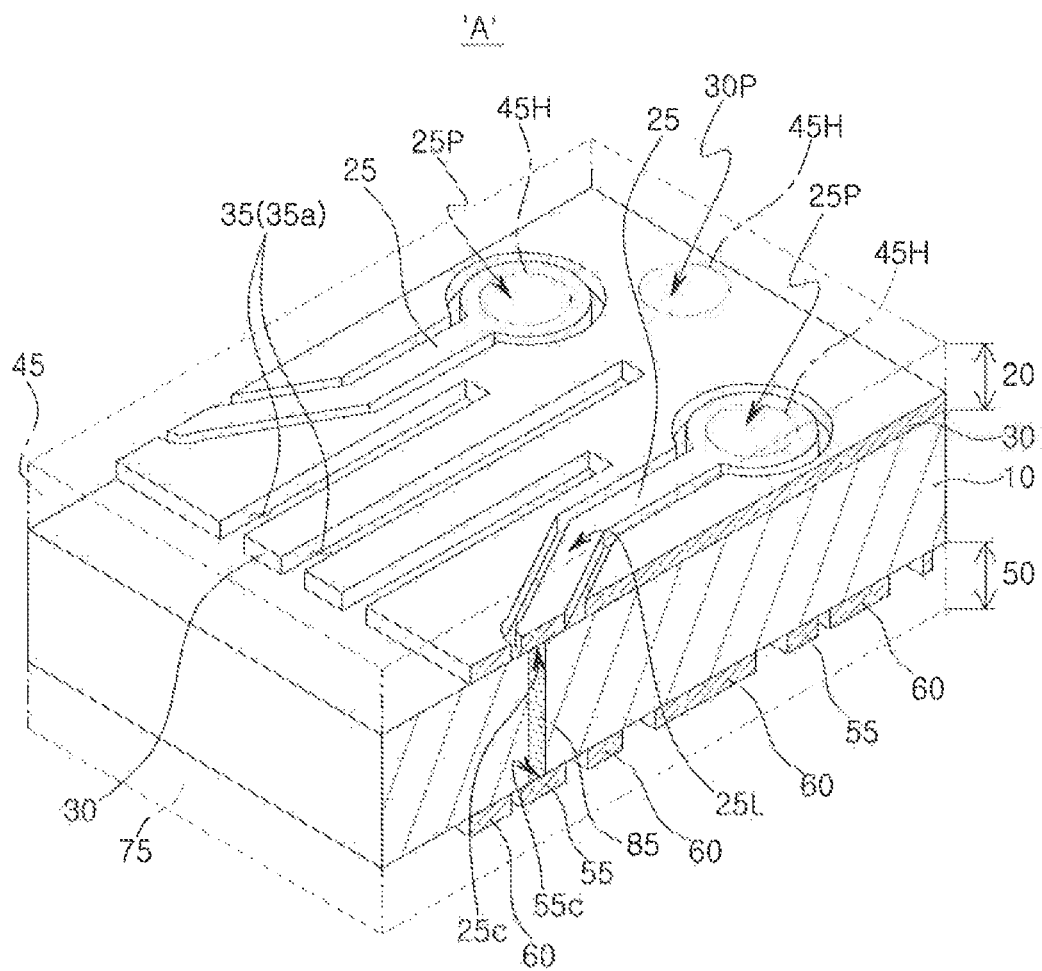
FIG. 1B is a partially enlarged top perspective view illustrating portion 'A' of FIG. 1A according to an exemplary embodiment of the present inventive concepts.

Referring to FIGS. 1A and 1B, a substrate structure according to an exemplary embodiment of the present inventive concepts will be described. FIG. 1A is a perspective view illustrating a substrate structure according to an exemplary embodiment of the present inventive concepts, and FIG. 1B is a partially enlarged perspective view of the portion indicated by 'A' of FIG. 1A which illustrates a substrate structure according to an exemplary embodiment of the present inventive concepts.

Referring to FIGS. 1A and 1B, a substrate structure 1 may include a base layer 10 and a first structure 20 disposed on a first surface 10S1 of the base layer 10. For example, in the exemplary embodiment shown in FIG. 1A, the first surface 10S1 is a top surface of the base layer 10.

In an exemplary embodiment, the substrate structure 1 may be a printed circuit board.

In an exemplary embodiment, the substrate structure 1 may be an interposer.

The first structure 20 may include a first plate structure 30, a first connection structure 25, and first openings 35 in the first plate structure.

The first connection structure 25 may be disposed on the same plane as the first plate structure 30.

The first connection structure 25 may be spaced apart from the first plate structure 30.

For example, a side surface of the first connection structure 25 may be surrounded by adjacent portions of the first plate structure 30 and be spaced apart from the adjacent portions of the first plate structure. In an exemplary embodiment, the first connection structure 25 may be disposed in an elongated hole in the first plate structure 30. The elongated hole may have contours which generally follow the shape of the first connection structure 25. Therefore, a length of the space between the side surfaces of the first plate structure 30 and the side surfaces of the first connection structure 25 may be substantially uniform. However, in alternative embodiments, the spacing between the side surfaces of the first connection structure 25 and the side surfaces of the first plate structure 30 may vary.

In an exemplary embodiment, the first connection structure 25 may be formed of a material that is the same as the material of the first plate structure 30. For example, the first connection structure 25 and the first plate structure 30 may include a conductive material such as copper, or the like.

As shown in FIG. 1B, at least some of the first openings 35 may have a line shape, such as a generally elongated rectangular shape.

In an exemplary embodiment, the first structure 20 may further include a first capping layer 45 disposed on the first connection structure 25 and the first plate structure 30. The capping layer 45 may cover the first surface 10S1 of the base layer 10. The first capping layer 45 may include an insulating material, such as epoxy resin, polyimide, plastic, ceramic, a polymer organic material, or the like.

The first capping layer 45 may include holes 45H that expose a first connection pad portion 25P of the first connection structure 25 and a first plate pad portion 30P of the first plate structure 30.

In an exemplary embodiment, the first capping layer 45 may fill the first openings 35.

In an exemplary embodiment, the first capping layer 45 may also fill the space between the first connection structure 25 and the first plate structure 30.

The substrate structure 1 may further include a second structure 50 on a second surface 10S2 of the base layer 10. In the base layer 10, the first surface 10S1 and the second surface 10S2 may oppose each other. The base layer 10 may be interposed between the first structure 20 and the second structure 50. For example, in the exemplary embodiment shown in FIG. 2A, the second surface 10S2 is on the bottom of the base layer. However, in other exemplary embodiments, the first surface 10S1 and second surface 10S2 may be positioned differently. For example, the second surface 10S2 may be on the top of the base layer and the first surface 10S1 may be on the bottom of the base layer.

Figure 2A:
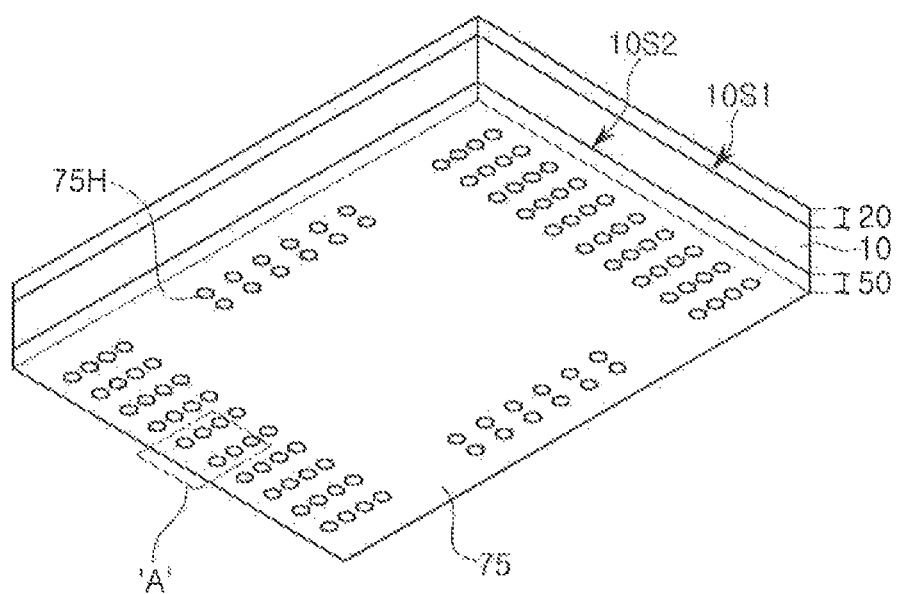
FIG. 2A is a bottom perspective view illustrating a substrate structure according to an exemplary embodiment of the present inventive concepts.
Figure 2B:
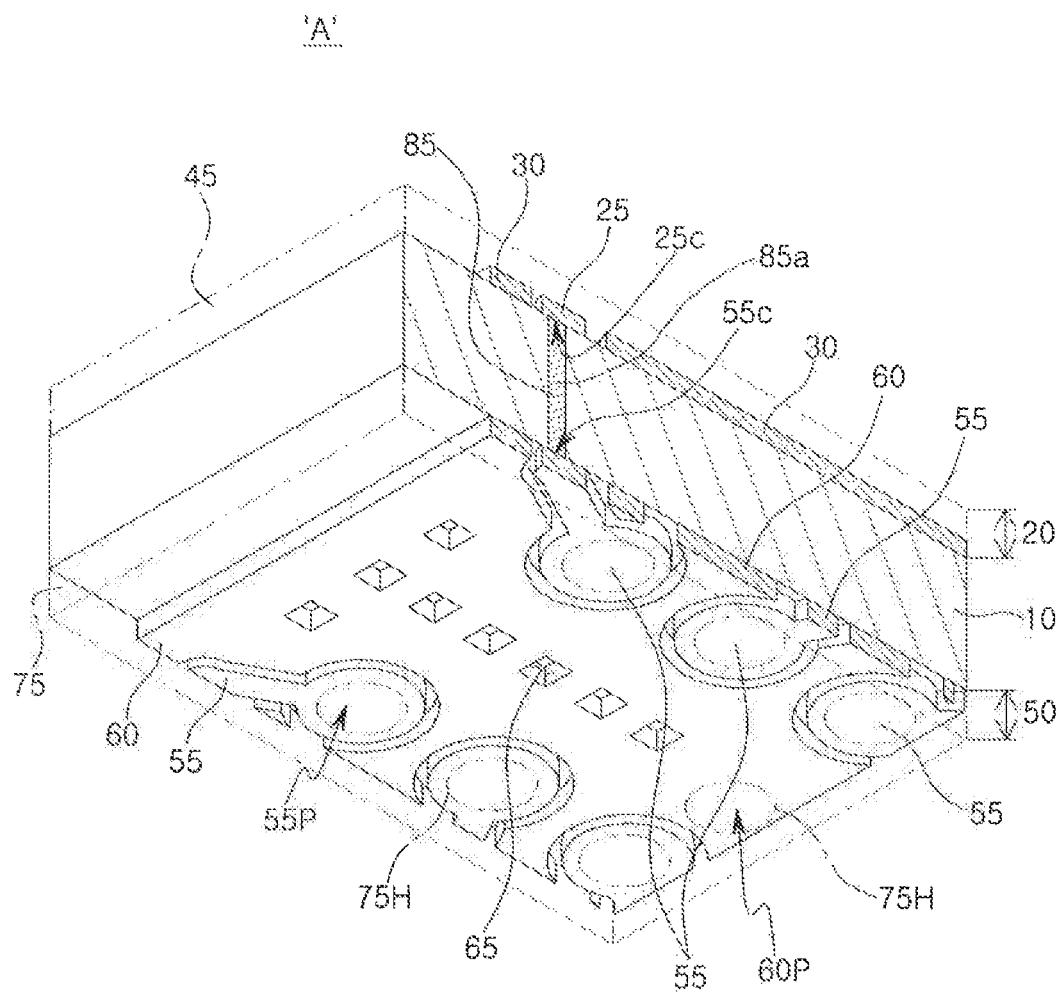
FIG. 2B is a bottom perspective view illustrating portion 'A' of FIG. 2A according to an exemplary embodiment of the present inventive concepts.

Referring to FIGS. 2A and 2B, together with FIGS. 1A and 1B, an exemplary embodiment of the second structure 50 will be described. FIG. 2A is a bottom perspective view, and FIG. 2B is a partially enlarged bottom perspective view of an enlarged portion indicated by 'A' of FIG. 2A.

Referring to FIGS. 1A, 1B, 2A, and 2B, the second structure 50 may include a second plate structure 60, a second connection structure 55, and second openings 65 in the second plate structure 60.

The second connection structure 55 may be disposed on the same plane as the second plate structure 60.

The second connection structure 55 may be spaced apart from the second plate structure 60.

A side surface of the second connection structure 55 may be surrounded by the second plate structure 60 and spaced apart from the second plate structure, as previously described with respect to the first connection structure 25 and first plate structure 30.

The second connection structure 55 may be formed of a material that is the same as the material of the second plate structure 60. For example, the second connection structure 55 and the second plate structure 60 may include a conductive material such as copper, or the like.

At least some of the second openings 65 may have a dot shape. The dot shape may be a shape such as a circle, an oval, a polygon, a rectilinear shape, a curved shape or the like.

At least some of the second openings 65 may not have a portion that extends to an edge of a side of the second plate structure 60 and may be closed. For example, the closed second openings 65 may have a closed dot shape in which all of the side surfaces of the dot shape are defined by the second plate structure 60.

In an exemplary embodiment, the second structure 50 may further include a second capping layer 75 disposed on the second connection structure 55 and the second plate structure 60 and covering the second surface 10S2 of the base layer 10. The second capping layer 75 may include an insulating material such as epoxy resin, polyimide, plastic, ceramic, a polymer organic material, or the like. The second capping layer 75 may include holes 75H exposing a second connection pad portion 55P of the second connection structure 55 and a second plate pad portion 60P of the second plate structure 60.

In an exemplary embodiment, the second capping layer 75 may fill the second openings 65.

In an exemplary embodiment, the second capping layer 75 may fill the space between the second connection structure 55 and the second plate structure 60.

In an exemplary embodiment, the substrate structure 1 may further include core electrodes 85 that pass through the base layer 10 to the first surface 10S1 and second surface 10S2.

The core electrodes 85 may include a first core electrode 85a electrically connecting the first connection structure 25 to the second connection structure 55. A portion of the first connection structure 25 that contacts the first core electrode 85a, is referred to as a first connection contact portion 25C.

As described previously with respect to FIG. 1B, at least some of the first openings 35 may have a line shape.

In an exemplary embodiment shown in FIG. 1B, at least some of the first openings 35 may be a first linear opening 35a. The first linear opening 35a may include a portion of a side wall that is open. For example, the first linear opening 35a may be disposed in the first plate structure 30 and may extend to an edge of a side of the first plate structure 30. This portion of a side surface of the first linear opening 35a may be open. The remaining portion of the side surfaces of the first linear opening 35a may be defined by the first plate structure 30. The first linear opening 35a, described above, may be referred to as "open" or "open-type".

Figure 3:
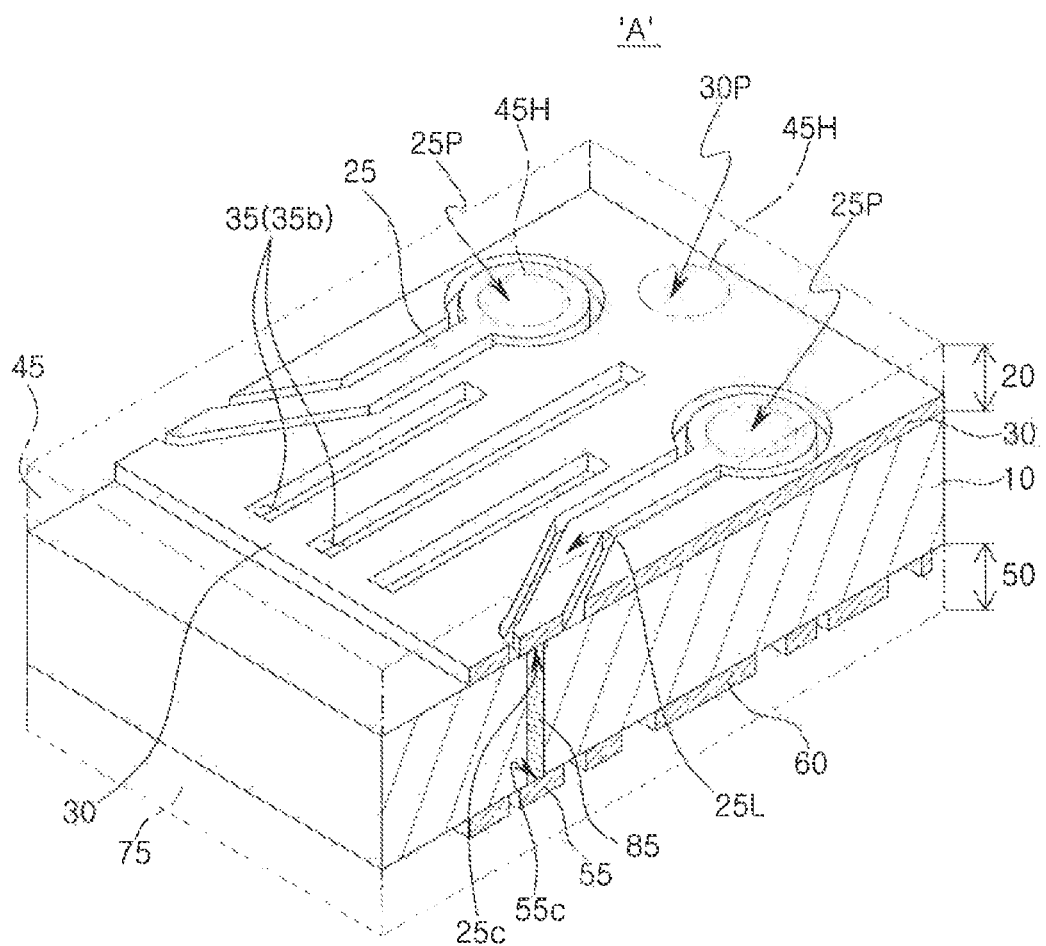
FIG. 3 is a partially enlarged top perspective view of portion 'A' of FIG. 1A illustrating an alternative configuration of a substrate structure according to an exemplary embodiment of the present inventive concepts.

A modified configuration of the first openings 35, described with reference to FIGS. 1A, 1B, 2A, and 2B, will be described with reference to FIG. 3. FIG. 3 is a partial perspective view illustrating a portion indicated by 'A' in FIG. 1A.

In the exemplary embodiment shown in FIG. 3, as described previously, the first plate structure 30 may include first openings 35. At least some of the first openings 35 may be a second linear opening 35b. All of the side surfaces (e.g., side walls) of the second linear opening 35b may be defined by the first plate structure 30 and may not extend to an edge of a side of the first plate structure 30. The second linear opening 35b, described above, may be referred to as "closed" or "closed-type".

Figure 4:
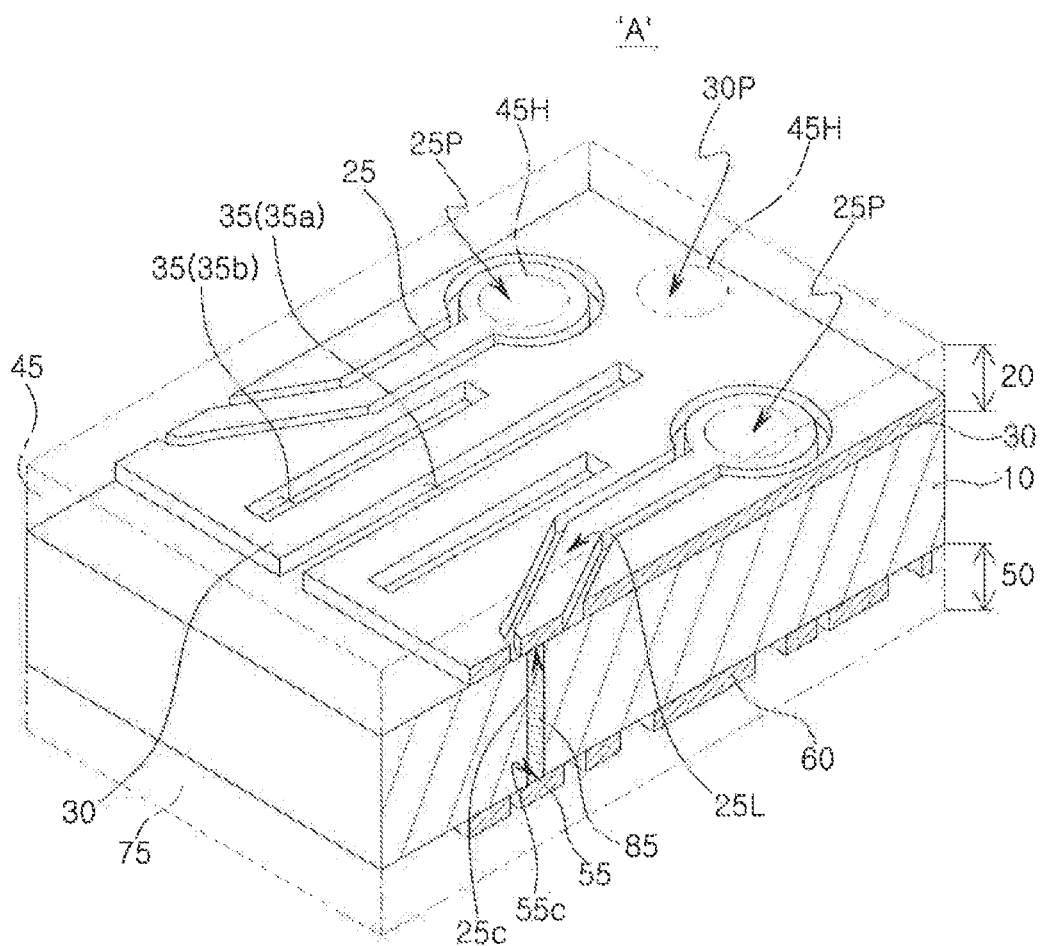
FIG. 4 is a partially enlarged top perspective view of portion 'A' of FIG. 1A illustrating an alternative configuration of a substrate structure according to an exemplary embodiment of the present inventive concepts.

Another configuration of the first openings 35, described with reference to FIGS. 1A, 1B, 2A, and 2B, will be described with reference to FIG. 5. FIG. 4 is a partial perspective view illustrating a portion indicated by 'A' in FIG. 1A.

In the exemplary embodiment shown in FIG. 4, as described previously, the first plate structure 30 may include the first openings 35. Some of the first openings 35 may be a first linear opening 35a which have a portion that extends to an edge of a side of the first plate structure 30. Other openings of the first openings 35 may be a second linear opening 35b that may not have a portion that extends to an edge of a side of the first plate structure 30. Therefore, the first linear opening 35a may be open as described with reference to FIG. 1A, and the second linear opening 35b may be closed as described with reference to FIG. 3.

Another configuration of the first openings 35, described with reference to FIGS. 1A, 1B, 2A, and 2B, will be described with reference to FIG. 5. FIG. 5 is a partial perspective view illustrating a portion indicated by 'A' in FIG. 1A.

Figure 5:
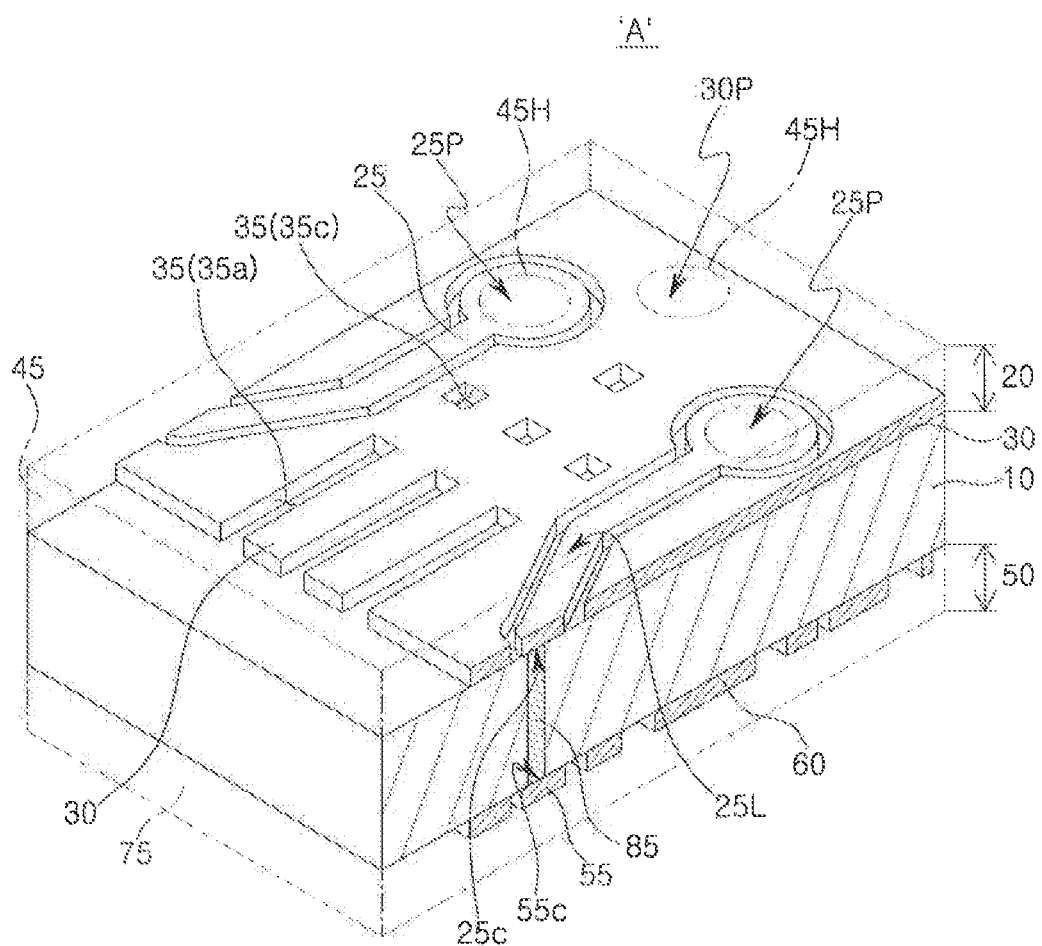
FIG. 5 is a partially enlarged top perspective view of portion 'A' of FIG. 1A illustrating an alternative configuration of a substrate structure according to an exemplary embodiment of the present inventive concepts.

In the exemplary embodiment shown in FIG. 5, as described previously, the first plate structure 30 may include the first openings 35. Some of the first openings 35 may be a first linear opening 35a having a line shape, and other openings of the first openings 35 may be first dot-shaped openings 35c having a dot shape. The first dot-shaped openings 35c may be closed.

Figure 6A:
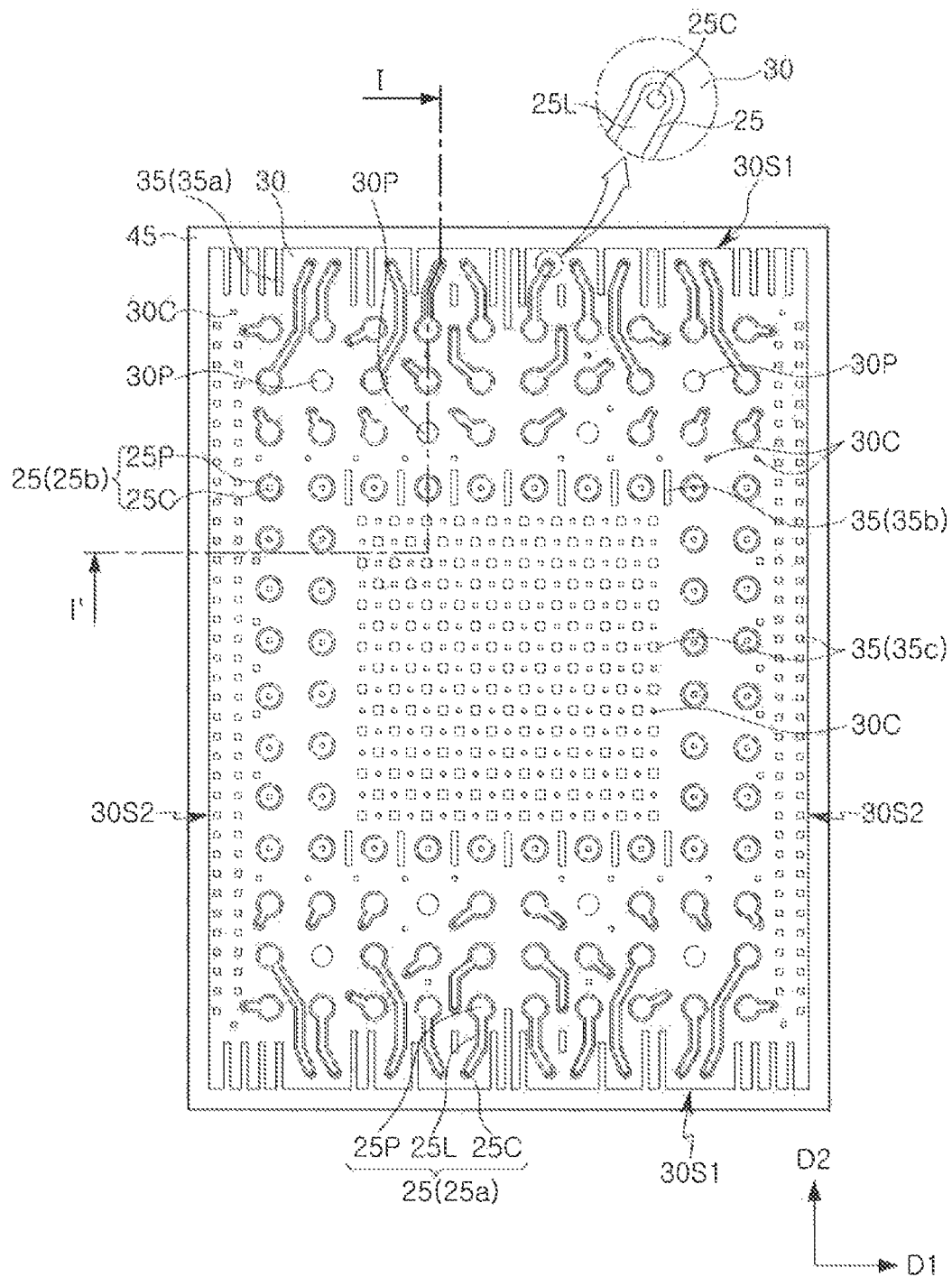
FIGS. 6A and 6B are plan views illustrating a substrate structure according to an exemplary embodiment of the present inventive concepts.

Referring to FIG. 6A, a plan view of an exemplary embodiment of the first plate structure 30, the first capping layer 45, the first connection structure 25, and the first openings 35, of the first structure 20 of the substrate structure 1, described above, will be described.

Referring to FIG. 6A together with FIGS. 1A and 1B, the first capping layer 45 may be larger than the first plate structure 30 in a plane defined by the first direction D1) and second direction D2. The first capping layer 45 may cover the first plate structure 30. In exemplary embodiments, the first plate structure 30 may have a polygonal shape, such as a quadrangular shape.

In an exemplary embodiment, the first connection structure 25 may be disposed on the same plane as the first plate structure 30 and may be spaced apart from the first plate structure 30, as previously described. A side surface of the first connection structure 25 may be surrounded by adjacent portions of the first plate structure 30 and be spaced apart from the adjacent portions of the first plate structure, as previously described.

In an exemplary embodiment, the first plate structure 30 may include a plurality of the first connection structures 25. At least some of the plurality of the first connection structures 25 may have all of their sides surrounded by adjacent portions of the first plate structure 30.

Each of the plurality of first connection structures 25 may have a first connection pad portion 25P and a first connection contact portion 25c.

As shown in FIG. 6A, some of the first connection structures 25a may include the first connection pad portion 25P and the first connection contact portion 25c spaced apart from each other. The remaining first connection structures 25b may include the first connection pad portion 25P and the first connection contact portion 25c overlapping each other.

The first connection structures 25a having the first connection pad portion 25P and the first connection contact portion 25c spaced apart from each other may further include a redistribution portion 25L connecting the first connection pad portion 25P to the first connection contact portion 25c.

In an exemplary embodiment, the first openings 35, disposed in the first plate structure 30, may include a first linear opening 35a that is open, a second linear opening 35b that is closed, and a first dot-shaped opening 35c. In the first plate structure 30, each of the first and second linear openings 35a and 35b may have a line shape, and the first dot-shaped opening 35c may have a dot shape such as a circle, an oval, a polygon, a rectilinear shape, a curved shape or the like.

The first linear opening 35a may be open and a portion of the side walls may extend to the edge of the first plate structure 30 and may not be defined by the first plate structure 30. The remaining portion of the side wall of the first linear opening 35a may be defined by the first plate structure 30. The second linear opening 35b may be closed and all of the side wall surfaces thereof may be defined by the first plate structure 30.

The first dot-shaped opening 35c may be closed and the entire side wall surfaces thereof may be defined by the first plate structure 30.

The first plate structure 30 may include a plurality of first plate contact portions 30C and a plurality of first plate pad portions 30P.

In an exemplary embodiment, the first plate structure 30 may have a quadrangular shape having first sides 30S1 opposing each other and second sides 30S2 opposing each other.

The first sides 30S1 of the first plate structure 30 may extend in the first direction D1 and may be perpendicular to a second direction D2. The second sides 30S2 of the first plate structure may extend in the second direction D2 and may be perpendicular to the first direction D1.

The first plate structure 30 may include a plurality of first plate pad portions 30P and a plurality of first plate contact portions 30C.

Figure 6B:
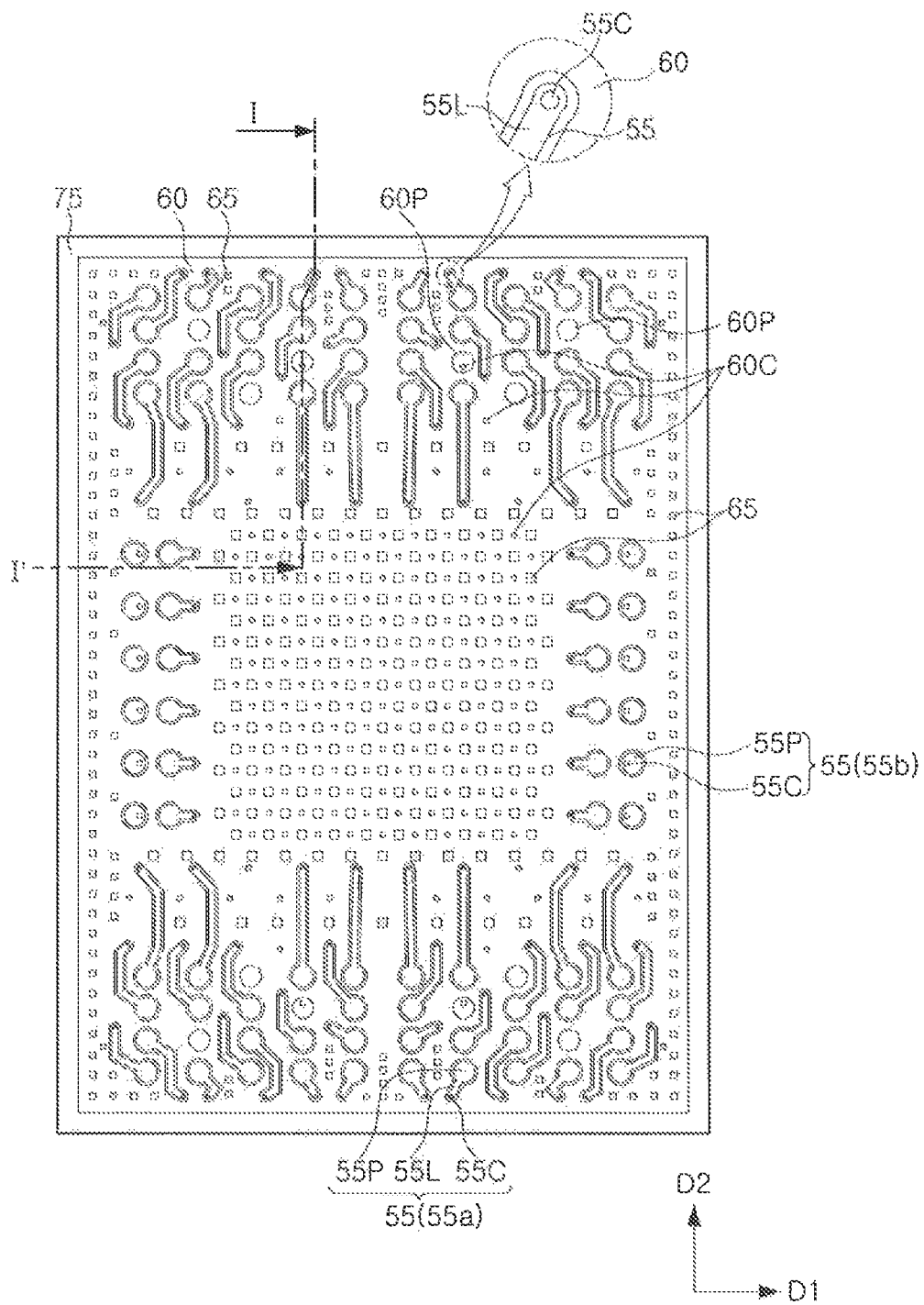

Referring to FIG. 6B, a plan view of the second plate structure 60, the second capping layer 75, the second connection structure 55, and the second openings 65, of the second structure 50 of the substrate structure 1 will be described. FIG. 6B is a plan view illustrating an exemplary embodiment of the second structure 50 of the substrate structure 1 described previously.

Referring to FIG. 6B together with FIGS. 1A and 1B, in a plane, the second capping layer 75 may be larger than the second plate structure 60 in the plane defined by the first direction D1 and the second direction D2. The second capping layer 75 may cover the second plate structure 60. The second plate structure 60 may have a polygonal shape, such as a quadrangular shape. However, in alternative embodiments, the second plate structure 60 may have a variety of different shapes.

In an exemplary embodiment, the second connection structure 55 may be spaced apart from the second plate structure 60, as previously described. The second connection structure 55 may be surrounded by the second plate structure 60 and spaced apart from the second plate structure, as previously described.

A plurality of the second connection structures 55 may be disposed on the second plate structure 60.

Each of the plurality of second connection structures 55 may have a second connection pad portion 55P and a second connection contact portion 55c.

Some of the second connection structures 55a may include the second connection pad portion 55P and the second connection contact portion 55c spaced apart from each other. In an exemplary embodiment, the remaining portion of the plurality of second connection structures 55b may include the second connection pad portion 55P and the second connection contact portion 55c, overlapping each other.

The second connection structure 55a, in which the second connection pad portion 55P and the second connection contact portion 55c are spaced apart from each other, may further include a redistribution portion 55L connecting the second connection pad portion 55P to the second connection contact portion 55c.

In an exemplary embodiment, at least some of the second openings 65, disposed in the second plate structure 60, may have a dot shape. At least some of the second openings 65 may be closed in which the entire side wall thereof is defined by the second plate structure 60 and there are no portions which extend to an edge of a side of the second plate structure 60.

The second plate structure 60 may include a plurality of second plate contact portions 60C and a plurality of second plate pad portions 60P.

Figure 7A:
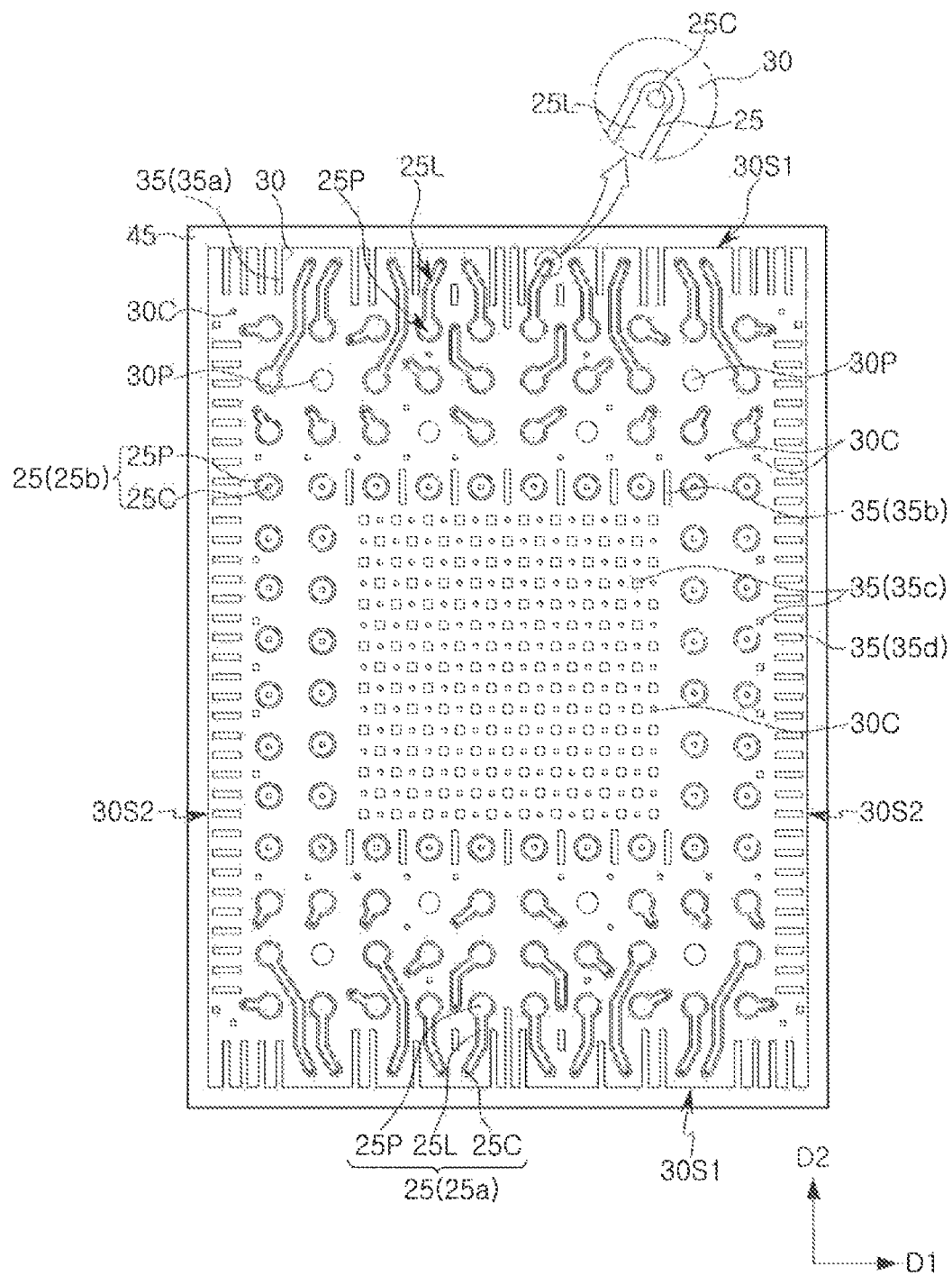
FIG. 7A is a plan view illustrating an alternative configuration of a substrate structure according to an exemplary embodiment of the present inventive concepts.

Another configuration of the first openings 35, described with reference to FIG. 6A, will be described with reference to FIG. 7A. FIG. 7A is a plan view illustrating an exemplary embodiment of the first structure 20 of the substrate structure 1 described previously.

Referring to FIG. 7A, some of the first openings 35 may be the open first linear opening 35a or the closed second linear opening 35b, parallel to the first direction D1. Some of the first openings 35 may be the first dot-shaped opening 35c, and some of the first openings 35 may be a third linear opening 35d which extends parallel to the first direction D1 and is closed. The first openings 35 may include the first and third linear openings 35a and 35d, extended in directions perpendicular to each other, and/or the second and third linear openings 35b and 35d, extended in directions perpendicular to each other.

A different configuration of the second openings 65, described with reference to FIG. 6B, will be described with reference to FIG. 7B.

Figure 7B:
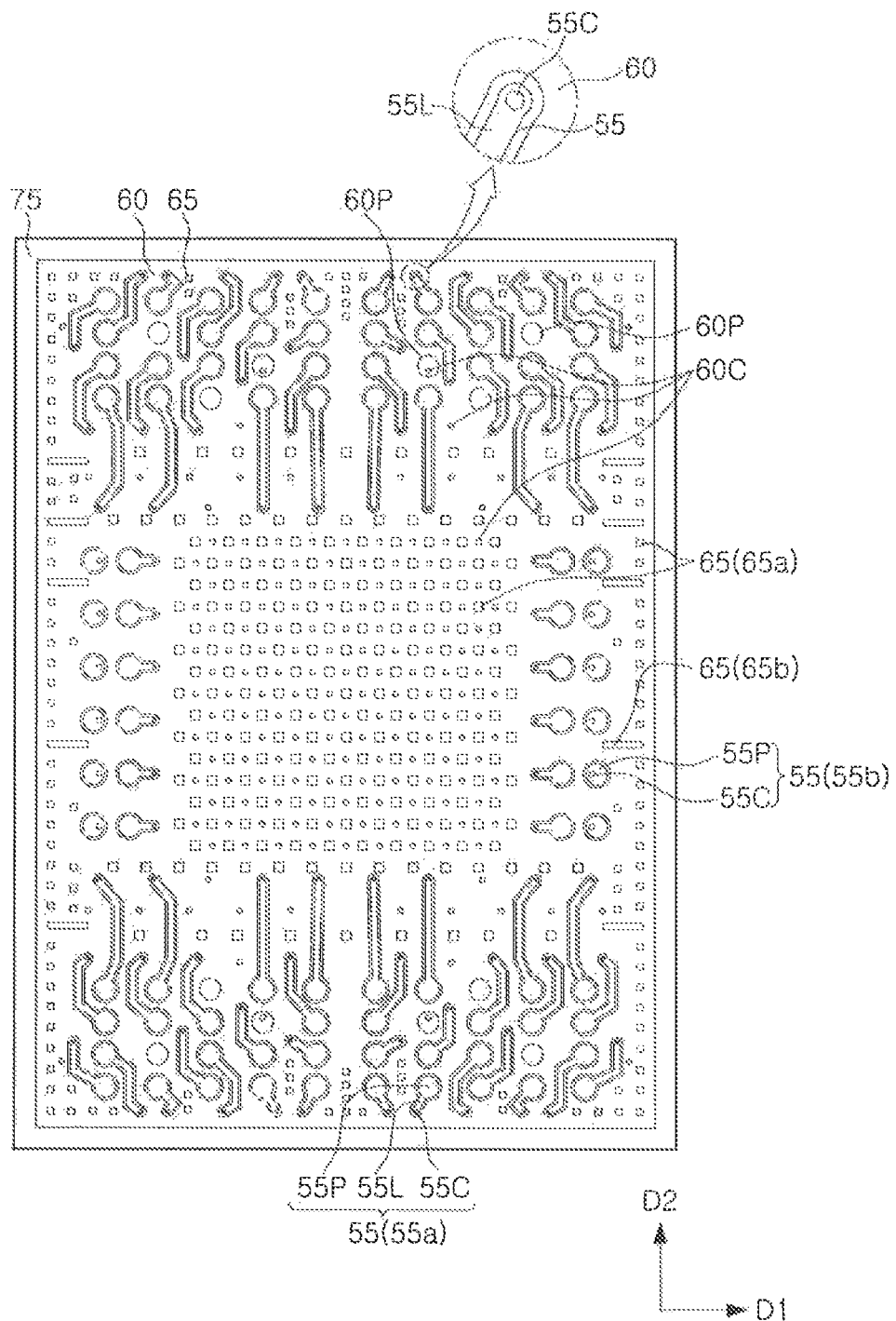
FIG. 7B is a plan view illustrating an alternative configuration of a substrate structure according to an exemplary embodiment of the present inventive concepts.

Referring to FIG. 7B, some of the second openings 65 may be a closed dot-shaped opening 65a, and other some thereof may be a closed linear opening 65b.

Figure 8A:
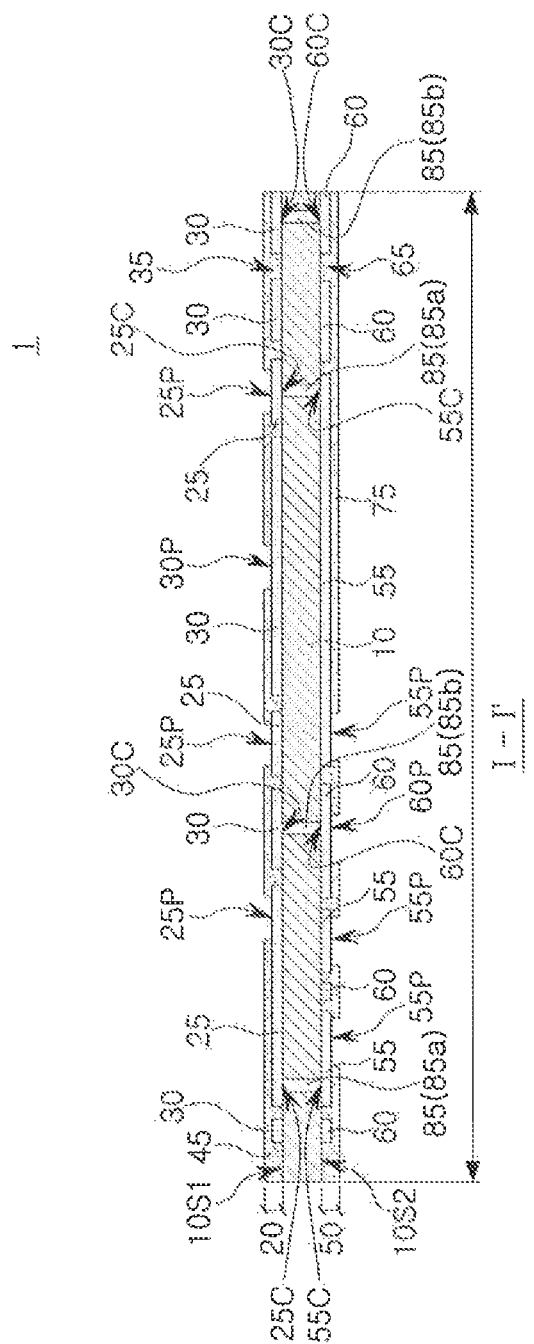
FIG. 8A is a cross-sectional view illustrating a substrate structure along lines I-I' of FIGS. 6A and 6B according to an exemplary embodiment of the present inventive concepts.

An example of a cross-sectional shape of the substrate structure 1, described previously with reference to FIGS. 6A, 6B, and 8A, will be described. FIG. 8A is a cross-sectional view illustrating a region taken along line I-I' of FIGS. 6A and 6B. Therefore, the above-mentioned components may be directly quoted without any explanation, or may be omitted, and a structure of a cross-sectional shape, not described above, among the above-mentioned components, will be mainly described.

Referring to FIGS. 1A, 1B, 6A, 6B, and 8A, as described above, the first plate structure 30 may include the first plate pad portions 30P and the first plate contact portions 30C, and the second plate structure 60 may include a plurality of second plate contact portions 60C and a plurality of second plate pad portions 60P. The core electrodes 85, disposed in the base layer 10, may include second core electrodes 85b electrically connecting the first plate structure 30 to the second plate structure 60.

In the first plate structure 30, portions in contact with the second core electrodes 85b may be first plate contact portions 30C. Portions exposed by holes 45H that are not covered by the first capping layer 45 may be the first plate pad portions 30P. In the second plate structure 60, portions in contact with the second core electrodes 85b may be second plate contact portions 60C. The portions exposed by holes 75H and not covered by the second capping layer 75 may be the second plate pad portions 60P.

In an exemplary embodiment, the first plate structure 30 and the second plate structure 60 may be electrically connected by the second core electrodes 85b.

An exemplary embodiment of the first structure 20 and the second structure 50 having a different configuration, will be described with reference to FIG. 8B.

Figure 8B:
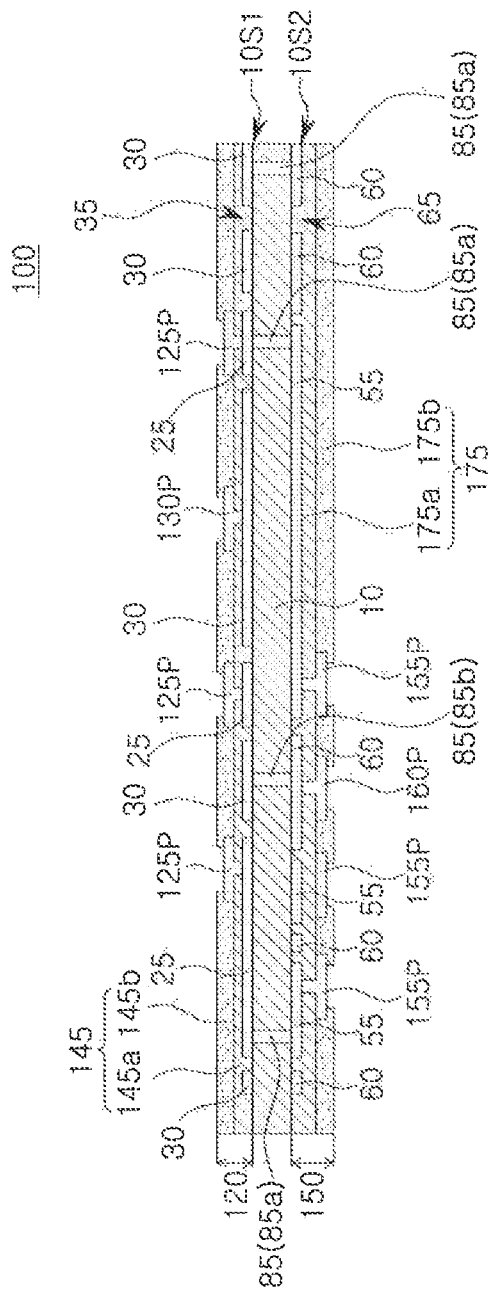
FIG. 8B is a cross-sectional view illustrating an alternative configuration of a substrate structure according to an exemplary embodiment of the present inventive concepts.

Referring to FIG. 8B, in an exemplary embodiment, the substrate structure 100 may include the base layer 10 described above. The base layer 10 may have a first surface 10S1 and a second surface 10S2, opposing each other.

A first structure 120 may be disposed on the first surface 10S1 of the base layer 10, and a second structure 150 may be disposed on the second surface 10S2 of the base layer 10.

In an exemplary embodiment, the first structure 120 may include the first connection structure 25, the first plate structure 30, and the first openings 35, disposed on the first surface 10S1 of the base layer 10, and the same as or similar to those described above.

In an exemplary embodiment, the second structure 150 may include the second connection structure 55, the second plate structure 60, and the second openings 65, disposed on the second surface 10S2 of the base layer 10, and the same as or similar to those described above.

In an exemplary embodiment, the first structure 120 may include a first plate pad portion 130P on the first plate structure 30, and a first connection pad portion 125P on the first connection structure 25. The first plate pad portion 130P and the first connection pad portion 125P may be positioned at levels higher than those of the first plate structure 30 and the first connection structure 25. Therefore, the first plate pad portion 130P and the first connection pad portion 125P may be non-planar in a direction of the thickness of the substrate structure 100 (e.g., in a direction perpendicular to the first direction D1 and second direction D2).

In an exemplary embodiment, the second structure 150 may include a second plate pad portion 160P on the second plate structure 60. The second structure 150 may also include a second connection pad portion 155P on the second connection structure 55. The second plate pad portion 160P and the second connection pad portion 155P may be located at levels higher than those of the second plate structure 60 and the second connection structure 55. Therefore, the second plate pad portion 160P and the second connection pad portion 155P may be non-planar with the second plate structure 60 and the second connection structure 55 in a direction of the thickness of the substrate structure 100 (e.g., in a direction perpendicular to the first direction D1 and second direction D2).

A "high level" may refer to a distance from the base layer 10 (e.g., a distance in the direction of the thickness of the substrate structure 100). For example, the first plate pad portion 130P and the first connection pad portion 125P may be further away from the base layer 10 as compared with the first plate structure 30 and the first connection structure 25. The second plate pad portion 160P and the second connection pad portion 155P may be further away from the base layer 10 as compared with the second plate structure 60 and the second connection structure 55.

The core electrodes 85, as described above, may be disposed in the base layer 10. The core electrodes 85 may include first core electrodes 85a that electrically connect the first and second connection structures 25 and 55. The core electrodes may also include second core electrodes 85b that electrically connect the first and second plate structures 30 and 60.

In an exemplary embodiment, the first structure 120 may include a first capping layer 145, and the second structure 150 may include a second capping layer 175. The first capping layer 145 may include a first lower base layer 145a and a first upper base layer 145b, sequentially stacked on the first surface 10S1 of the base layer 10. The second capping layer 175 may include a second lower base layer 175a and a second upper base layer 175b, sequentially stacked on the second surface 10S2 of the base layer 10.

The first lower base layer 145a may cover the first plate structure 30 and the first connection structure 25 while covering the first surface 10S1 of the base layer 10. The first upper base layer 145b may include holes that expose an upper surface of the first plate pad portion 130P and an upper surface of the first connection pad portion 125P while the remaining portion of the first upper base layer covers the first lower base layer 145a. The first plate pad portion 130P may be electrically connected to the first plate structure 30 while passing through the first lower base layer 145a. The first connection pad portion 125P may be electrically connected to the first connection structure 25 and may pass through the first lower base layer 145a.

The second lower base layer 175a may cover the second plate structure 60 and the second connection structure 55 while covering the second surface 10S2 of the base layer 10. The second upper base layer 175b may include holes that expose an upper surface of the second plate pad portion 160P and an upper surface of the second connection pad portion 155P while the remaining portion of the second upper base layer covers the second lower base layer 175a. The second plate pad portion 160P may be electrically connected to the second plate structure 60 while passing through the second lower base layer 175a. The second connection pad portion 155P may be electrically connected to the second connection structure 55 while passing through the second lower base layer 175a.

Various types of semiconductor packages, including the substrate structures 1 and 100, described above, will be described.

Figure 9:
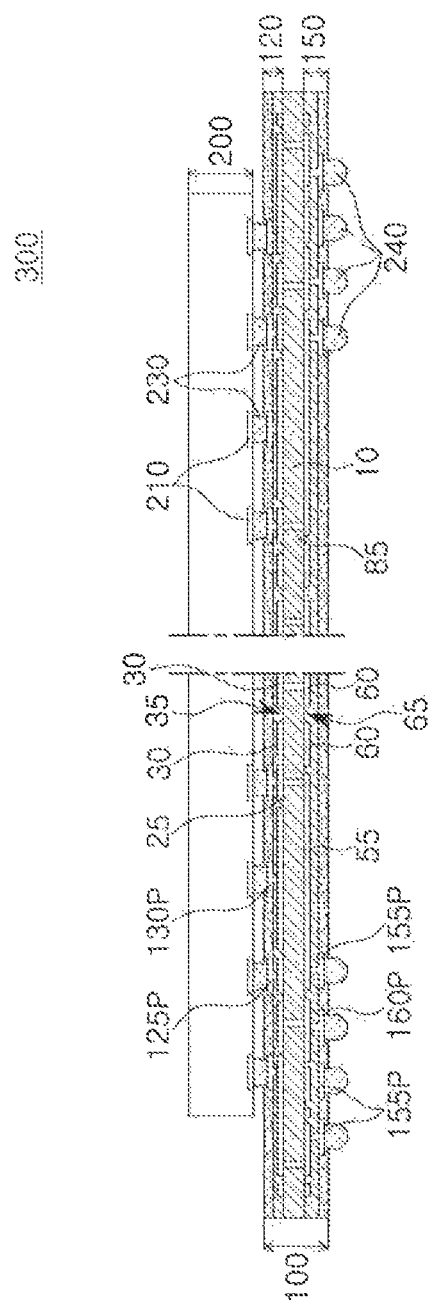
FIG. 9 is a cross-sectional view illustrating a semiconductor package including a substrate structure according to an exemplary embodiment of the present inventive concepts.

A semiconductor package including a substrate structure according to an exemplary embodiment will be described with reference to FIG. 9. FIG. 9 is a cross-sectional view illustrating a semiconductor package including a substrate structure according to an exemplary embodiment.

Referring to FIGS. 8B and 9, in an exemplary embodiment, a semiconductor package 300 may include the substrate structure 100 described in FIG. 8B. The semiconductor package 300 may include a semiconductor chip 200 on the substrate structure 100. The semiconductor chip 200 may be mounted on the substrate structure 100 by connection patterns 230. For example, the semiconductor chip 200 may include chip pads 210 disposed in positions corresponding to the first plate pad portion 130P and the first connection pad portion 125P of the substrate structure 100. The connection patterns 230 may connect the first plate pad portion 130P and the first connection pad portion 125P of the substrate structure 100, to the chip pads 210 of the semiconductor chip 200. In an exemplary embodiment, the connection patterns 230 may include a solder material.

The semiconductor package 300 may include lower patterns 240 disposed in a lower portion of the substrate structure 100. The lower patterns 240 may be connected to the second plate pad portion 160P and the second connection pad portion 155P of the substrate structure 100. The lower patterns 240 may be solder balls.

In an exemplary embodiment, the semiconductor chip 200 may be a logic chip or a memory chip. However, in other exemplary embodiments, the semiconductor chip may be another device known in the art.

Figure 10:
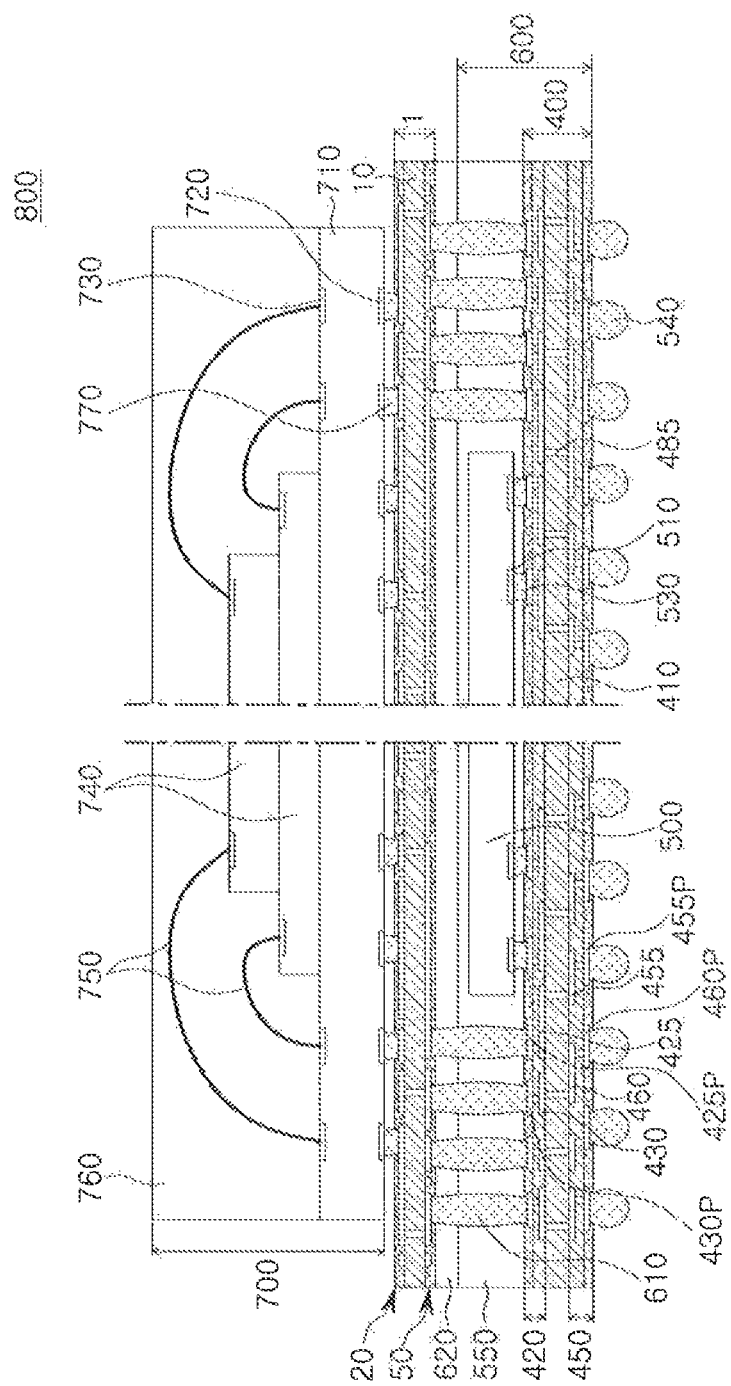
FIG. 10 is a cross-sectional view illustrating another example of a semiconductor package including a substrate structure according to an exemplary embodiment of the present inventive concepts.

An example of a semiconductor package including a substrate structure according to an exemplary embodiment will be described with reference to FIG. 10. FIG. 10 is a cross-sectional view illustrating a semiconductor package including a substrate structure according to an exemplary embodiment.

Referring to FIG. 10, in an exemplary embodiment, a semiconductor package 800 may include a lower structure 600, a substrate structure 1 on the lower structure 600, and an upper structure 700 on the substrate structure 1.

The lower structure 600 may be a lower semiconductor package including a lower printed circuit board 400 and a lower semiconductor chip 500 on the lower printed circuit board 400. For example, the lower semiconductor chip 500 may be mounted on the lower printed circuit board 400 while having a flip chip structure, by lower chip connection patterns 530, connected to lower chip pads 510 of the lower semiconductor chip 500.

In an exemplary embodiment, the lower structure 600 may include solder balls 540 disposed in a lower portion of the lower printed circuit board 400.

In an exemplary embodiment, the lower printed circuit board 400 may include a lower base layer 410, a lower core electrode 485 in the lower base layer 410, a first structure 420 above the lower base layer 410, and a second structure 450 below the lower base layer 410.

The first structure 420 may include a first connection structure 425 and a first plate structure 430. The first structure 420 may include a first plate pad portion 430P electrically connected to the first plate structure 430, and a first connection pad portion 425P electrically connected to the first connection structure 425. The second structure 450 may include a second connection structure 455 and a second plate structure 460. The second structure 450 may further include a second plate pad portion 460P electrically connected to the second plate structure 460, and a second connection pad portion 455P electrically connected to the second connection structure 455.

The lower structure 600 may further include a lower mold layer 550 on the lower printed circuit board 400.

The substrate structure 1 may be an interposer substrate that is disposed between the lower structure 600 and the upper structure 700. For example, the substrate structure 1 may be a printed circuit board, which may be used as an interposer. For example, the base layer 10 of the substrate structure 1 may include various insulating materials used for a printed circuit board, for example, an insulating material including a glass fiber. However, exemplary embodiments of the present inventive concepts are not limited thereto. For example, the substrate structure 1 may be an interposer substrate formed using a silicon wafer. For example, the base layer 10 of the substrate structure 1 may be a silicon substrate having an upper surface and a lower surface covered by an insulating layer.

In an exemplary embodiment, the substrate structure 1 may have a structure substantially the same as that of the substrate structure 1 described with reference to FIGS. 1 to 8A. Therefore, components of the substrate structure 1 may have the previously described structure and will be discussed herein without further description.

The semiconductor package 800 may further include an insulating layer 620 disposed between the lower structure 600 and the substrate structure 1.

The semiconductor package 800 may further include intermediate connection patterns 610 electrically connecting the substrate structure 1 to the lower structure 600. The intermediate connection patterns 610 may connect the substrate structure 1 to the lower printed circuit board 400 of the lower structure 600 while passing through the insulating layer 620 and the lower mold layer 550. The intermediate connection patterns 610 may include a solder material.

The upper structure 700 may be mounted on the substrate structure 1. The upper structure 700 may include an upper printed circuit board 710, and an upper semiconductor chip 740 mounted on the upper printed circuit board 710. In an exemplary embodiment, the upper semiconductor chip 740 may be electrically connected to first upper chip pads 730 of the upper printed circuit board 710 by at least one bonding wire 750. In the exemplary embodiments shown in FIG. 10, a plurality of bonding wires connects the first upper chip pads 730 of the upper printed circuit board to the upper semiconductor chip 740. The upper structure 700 may further include an upper mold layer 760 covering the upper printed circuit board 710. The upper mold layer 760 may cover the upper semiconductor chip 740 and the at least one bonding wire 750.

In an exemplary embodiment, the lower semiconductor chip 500 may be a logic chip, and the upper semiconductor chip 740 may be a memory chip.

The semiconductor package 800 may further include upper connection patterns 770 disposed between the upper structure 700 and the substrate structure 1. The upper connection patterns 770 may include a solder material. In an exemplary embodiment, the upper structure 700 may be spaced apart from the substrate structure 1.

In an exemplary embodiment, forming the semiconductor package 800 may include forming each of the lower structure 600 and the substrate structure 1. The substrate structure 1 may be combined with the lower structure 600 using the intermediate connection patterns 610. A gap may be filled between the substrate structure 1 and the lower structure 600 with the insulating layer 620. Forming the semiconductor package 800 may further include mounting the upper structure 700 on the substrate structure 1 combined with the lower structure 600.

In an exemplary embodiment, the combining the substrate structure 1 with the lower structure 600 using the intermediate connection patterns 610 may include forming a first solder ball in a lower portion of the substrate structure 1. A second solder ball may be formed in each of the holes of the lower mold layer 550 of the lower structure 600. The intermediate connection patterns 610 may be formed by combining the first solder ball in a lower portion of the substrate structure 1 with the second solder ball in the lower structure 600, by performing a solder reflow process. The substrate structure 1 having the first solder ball formed therein may be prepared as a separate unit using a printed circuit board formation process. The substrate structure 1 may move upwardly of the lower structure 600 having the second solder ball formed therein. The first solder ball of the substrate structure 1 and the second solder ball of the lower structure 600, described above, may be combined with each other, to perform a solder reflow process for forming the intermediate connection patterns 610. The solder reflow process, described above, may be performed at a temperature higher than room temperature, for example, a temperature of 230° C. or less. As the substrate structure 1 is exposed to thermal atmosphere due to the solder reflow process described above, conductive material layers in the substrate structure 1 may be thermally expanded. The substrate structure 1 according to exemplary embodiments may include the first plate structure 30 and the second plate structure 60. The first plate structure 30 and the second plate structure 60 may be expanded by the thermal atmosphere of the solder reflow process. The first openings 35, in the first plate structure 30, and the second openings 65, in the second plate structure 60, may serve to prevent or significantly reduce excessive bending or irregular deformation of the substrate structure 1, which may occur while the first plate structure 30 and the second plate structure 60 are expanded, by the thermal atmosphere of the solder reflow process. For example, when the substrate structure 1 is divided into various regions and viewed, there may be a region, among the divided regions, in which a planar area, occupied by the first openings 35 and the first plate structure 30, is greater than a planar area, occupied by the second openings 65 and the second plate structure 60. For example, referring to FIGS. 1A and 1B, in a region, indicated by 'A' of the substrate structure 1, the planar area, occupied by the first openings 35 and the first plate structure 30, may be greater than the planar area, occupied by the second openings 65 and the second plate structure 60.

If the first and second openings 35 and 65 are not provided in the region indicated by 'A' of the substrate structure 1 described above, a planar area or volume of the first plate structure 30 may be greater than that of the second plate structure 60. Therefore, thermal expansion of the first plate structure 30 may have a greater effect on bending properties of the substrate structure 1. However, in the region indicated by 'A' of the substrate structure 1, as described above, at least some of the first openings 35 may be formed to have a line shape, perpendicular to an edge of the first plate structure 30. The first openings 35 may significantly reduce deformation of the first plate structure 30, caused by the thermal expansion of the first plate structure 30. Accordingly, the bending properties of the substrate structure 1 may be controlled to minimize or eliminate excessive bending or deformation of the substrate structure. Therefore, the substrate structure 1 may be mounted on the lower structure 600 using a solder reflow process without causing excessive bending or deformation of the substrate structure 1.

Thus, when the substrate structure 1, described above, is used as an interposer substrate, interposed between the semiconductor packages, or used as a printed circuit board with a semiconductor chip mounted thereon, bending properties of the substrate structure 1 may be solved as described above. In this regard, a defect rate of a process for formation of a semiconductor package may be reduced using the substrate structure 1.

In exemplary embodiments, the first plate structure 30 and the second plate structure 60, included in the semiconductor packages 300 and 800, may have improved noise reduction and solve noise characteristics of the semiconductor packages 300 and 800.

In exemplary embodiments, the first plate structure 30 and the second plate structure 60, included in the semiconductor packages 300 and 800, may be grounded. Therefore, since the first plate structure 30 and the second plate structure 60 are ground plates, ground characteristics of the semiconductor packages 300 and 800 may also be improved.

In exemplary embodiments, since the first plate structure 30 and the second plate structure 60, included in the semiconductor packages 300 and 800, are formed of a conductive material, electromagnetic waves may be shielded. Therefore, the inclusion of the first plate structure and the second plate structure may improve electromagnetic wave shielding properties of the semiconductor packages 300 and 800.

In exemplary embodiments, since the semiconductor packages 300 and 800 are formed using the substrate structures 1 and 100 which control bending properties by including the first and second plate structures 30 and 60, having the first and second openings 35 and 65, productivity of the manufacture of the semiconductor packages 300 and 800 may be improved.

As set forth above, according to exemplary embodiments of the present inventive concept, a substrate structure or a printed circuit board, including a base layer and a plate structure, may be provided. Openings having a line shape may be disposed in the plate structure. Since the openings described above may control bending characteristics of a substrate structure due to a plate structure, excessive bending or deformation of a substrate structure exposed to high temperatures (e.g., during a solder reflow process) may be solved.

A semiconductor package including the substrate structure may be provided. The plate structure may be grounded.

A semiconductor package including the plate structure described above may have improved ground characteristics.

Moreover, noise characteristics of a semiconductor package including the substrate structure may be solved.

In addition, productivity of the manufacturing of a semiconductor package including the substrate structure may be improved.

While exemplary embodiments have been shown and described above, it will be apparent to those skilled in the art that modifications and variations could be made without departing from the scope of the present disclosure, as defined by the appended claims.

What is claimed is:

1. A printed circuit board, comprising:
    a base layer having a first surface and a second surface opposing each other; and
    a first structure on the first surface of the base layer,
    wherein the first structure includes a first plate structure, and a first connection structure disposed on a same plane as the first plate structure and spaced apart from the first plate structure,
    the first plate structure includes first openings,
    at least some of the first openings are linear openings having a line shape, and
    wherein the first structure further includes a first capping layer disposed on the first surface of the base layer, the first capping layer covering the first plate structure and filling the first openings.

2. The printed circuit hoard of claim 1, wherein the first capping layer includes holes exposing a pad portion of the first plate structure and a pad portion of the first connection structure,
    an entirety of the first connection structure is spaced apart from the first plate structure, and
    the first plate structure is formed of the same conductive material as the first connection structure.

3. The printed circuit board of claim 1, wherein all side surfaces of the first connection structure are surrounded by adjacent portions of the first plate structure.

4. The printed circuit board of claim 1, wherein the first openings further include openings having a dot shape.

5. The printed circuit board of claim 1, wherein all side surfaces of at least one of the linear openings are defined by the first plate structure.

6. The printed circuit board of claim 1, wherein a portion of side surfaces of at least one of the linear openings is defined by the first plate structure, and a remaining portion of the side surfaces of the at least one of the linear openings extends to an edge of the first plate structure and is open.

7. The printed circuit board of claim 1, wherein the linear openings include a first linear opening and a second linear opening;
    all side surfaces of the first linear opening are defined by the first plate structure,
    a portion of the side surfaces of the second linear opening extends to an edge of the first plate structure and is open, and a remaining portion of the side surfaces of the second linear opening is defined by the first plate structure.

8. The printed circuit board of claim 7, wherein the first openings further include openings having a dot shape.

9. The printed circuit board of claim 1, further comprising:
    a second structure on the second surface of the base layer,
    wherein the base layer is disposed between the first structure and the second structure, and the second structure includes a second plate structure, a second connection structure disposed on a same plane as the second plate structure and spaced apart from the second plate structure, the second plate structure including second openings.

10. The printed circuit board of claim 9, further comprising:
a first core electrode disposed in the base layer and configured to electrically connect the first connection structure to the second connection structure.

11. The printed circuit board of claim 10, further comprising:
a second core electrode disposed in the base layer and configured to electrically connect the first plate structure to the second plate structure.

12. The printed circuit board of claim 9, further comprising:
a second capping layer disposed on the second surface of the base layer, the second capping layer covering the second plate structure and filling the second openings, wherein the second capping layer includes holes exposing a pad portion of the second plate structure and a pad portion of the second connection structure.

13. A semiconductor package, comprising:
a substrate structure; and
a semiconductor chip on the substrate structure,
wherein the substrate structure includes a base layer and a first structure on a first surface of the base layer,
the first structure includes a first plate structure, first connection structures spaced apart from the first plate structure, and first openings in the first plate structure,
at least some of the first connection structures have all side surfaces surrounded by the first plate structure, and
at least some of the first openings have a line shape.

14. The semiconductor package of claim 13, further comprising:
a second structure on a second surface of the base layer,
wherein the base layer is disposed between the first structure and the second structure,
the second structure includes a second plate structure, second connection structures spaced apart from the second plate structure, and second openings in the second plate structure, and
at least some of the second openings are openings having a dot shape.

15. The semiconductor package of claim 13, wherein some of the first openings have a dot shape.

16. The semiconductor package of claim 13, wherein the first structure further includes a capping layer covering the first plate structure and filling the first openings,
wherein the first capping layer includes holes exposing a pad portion of the first plate structure and a pad portion of the first connection structure,
an entirety of the first connection structure is spaced apart from the first plate structure, and the first plate structure is formed of the same conductive material as the first connection structure.

17. A semiconductor package, comprising:
a lower structure;
a substrate structure on the lower structure; and
an upper structure on the substrate structure,
wherein the substrate structure includes a base layer and a first structure,
the first structure includes a first plate structure, and a first connection structure disposed on a same plane as the first plate structure and spaced apart from the first plate structure,
the first plate structure includes first openings, and
at least some of the first openings are linear openings having a line shape.

18. The semiconductor package of claim 17, further comprising:
a second structure,
wherein the base layer is disposed between the first structure and the second structure,
the second structure includes a second plate structure, and a second connection structure disposed on a same plane as the second plate structure and spaced apart from the second plate structure,
the second plate structure includes second openings, and
at least some of the second openings have a dot shape.

19. The semiconductor package of claim 17, further comprising a first capping layer covering, the first plate structure and filling the first openings,
wherein the first capping layer includes holes exposing a pad portion of the first plate structure and a pad portion of the first connection structure,
an entirety of the first connection structure is spaced apart from the first plate structure, and
the first plate structure is formed of the same conductive material as the first connection structure.

20. The semiconductor package of claim 17, further comprising:
intermediate connection patterns configured to connect the lower structure to the substrate structure; and
upper connection patterns configured to connect the substrate structure to the upper structure,
wherein the lower structure includes a lower printed circuit board and a lower semiconductor chip on the lower printed circuit board,
the upper structure includes an upper printed circuit board and an upper semiconductor chip on the upper printed circuit board,
the intermediate connection patterns are configured to connect the lower printed circuit board to the substrate structure, and
the upper connection patterns are configured to connect the upper printed circuit board to the substrate structure.

* * * * *